(12) United States Patent
Koike

(10) Patent No.: US 10,715,062 B2
(45) Date of Patent: Jul. 14, 2020

(54) DRIVING APPARATUS, DRIVING SYSTEM, ROBOT, IMAGE FORMING APPARATUS, AND CONVEYING APPARATUS

(71) Applicant: Takahisa Koike, Tokyo (JP)

(72) Inventor: Takahisa Koike, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/287,325

(22) Filed: Feb. 27, 2019

(65) Prior Publication Data

US 2019/0288620 A1 Sep. 19, 2019

(30) Foreign Application Priority Data

Mar. 16, 2018 (JP) .................... 2018-050044

(51) Int. Cl.
```
H02P 6/28      (2016.01)
H02P 6/18      (2016.01)
G03G 15/00     (2006.01)
G01R 19/165    (2006.01)
G03G 21/16     (2006.01)
```

(52) U.S. Cl.
CPC .......... *H02P 6/28* (2016.02); *G01R 19/16528* (2013.01); *G03G 15/5004* (2013.01); *G03G 15/602* (2013.01); *G03G 15/6529* (2013.01); *G03G 21/1647* (2013.01); *H02P 6/18* (2013.01)

(58) Field of Classification Search
None
See application file for complete search history.

(56) References Cited

U.S. PATENT DOCUMENTS

| | | | | |
|---|---|---|---|---|
| 4,596,185 A | * | 6/1986 | Enter | B41K 3/14 101/235 |
| 5,152,141 A | * | 10/1992 | Rumford | B64D 41/00 60/778 |
| 5,558,589 A | * | 9/1996 | Schmidt | B60L 50/16 475/5 |
| 8,928,270 B2 | | 1/2015 | Sakamoto et al. | |

(Continued)

FOREIGN PATENT DOCUMENTS

| | | |
|---|---|---|
| JP | 2002-295610 | 10/2002 |
| JP | 2013-009532 | 1/2013 |
| JP | 2013-094037 | 5/2013 |

*Primary Examiner* — Bentsu Ro
(74) *Attorney, Agent, or Firm* — IPUSA, PLLC

(57) ABSTRACT

A driving apparatus allowing two motors to drive a same driving shaft is provided. When a voltage command value is less than a predetermined threshold, a control unit outputs driving command values based on one control pattern such that a direction of a torque of one of the motors becomes different from a driving direction of the driving shaft. Also, when the voltage command value becomes greater than or equal to the predetermined threshold, the control unit outputs the driving command values based on another control pattern, such that the direction of the torque of the one of the motors becomes the same as the driving direction of the driving shaft when the voltage command value is greater than or equal to the predetermined threshold, and does not become different from the driving direction of the driving shaft when the voltage command value drops below the predetermined threshold.

9 Claims, 12 Drawing Sheets

(56) References Cited

U.S. PATENT DOCUMENTS

| | | | | |
|---|---|---|---|---|
| 2004/0113571 A1* | 6/2004 | Kumar | ............... | B60L 3/0023 |
| | | | | 318/34 |
| 2010/0260616 A1* | 10/2010 | Osawa | ............... | F04D 19/007 |
| | | | | 417/53 |
| 2014/0228160 A1* | 8/2014 | Chung | ............... | B60K 6/50 |
| | | | | 475/5 |
| 2016/0068159 A1* | 3/2016 | Zou | ............... | B60W 10/02 |
| | | | | 701/22 |
| 2018/0346014 A1* | 12/2018 | Beyerlein | ............... | B62D 5/0409 |

* cited by examiner

DRIVING APPARATUS, DRIVING SYSTEM, ROBOT, IMAGE FORMING APPARATUS, AND CONVEYING APPARATUS

CROSS-REFERENCE TO RELATED APPLICATION

The present application claims priority under 35 U.S.C. § 119 to Japanese Patent Application No. 2018-050044, filed on Mar. 16, 2018, the entire contents of which are incorporated herein by reference.

BACKGROUND OF THE INVENTION

1. Field of the Invention

The disclosures herein generally relate to a driving apparatus, a driving system, a robot, an image forming apparatus, and a conveying apparatus.

2. Description of the Related Art

Conventionally, a technology is known in the art that allows two motors to drive a same driving shaft so as to improve a driving torque of the driving shaft and eliminate backlash between the two motors and the driving shaft.

For example, Patent Document 1 below discloses a technology that allows torques of a first motor and a second motor to be highly efficiently controlled by correcting control values of the first motor and the second motor that drive a same load shaft.

In Patent Document 1 below, when angular velocity V indicated by a speed command is 0, pre-torques, acting in opposite directions, of the first motor and the second motor are applied to the load shaft, thereby eliminating backlash between the load shaft and the first and the second motors.

Also, in Patent Document 1 below, when the angular velocity V indicated by the speed command is greater than or equal to a predetermined threshold, torques, acting in the same direction, of the first motor and the second motor are applied to the load shaft, thereby causing the load shaft to be rotated by a combined torque of the first motor and the second motor.

Namely, the technology disclosed in Patent Document 1 employs an approach that causes the direction of the torque of the second motor applied to the load shaft to be switched by using the predetermined threshold as a boundary. However, with the technology disclosed in Patent Document 1, when the angular velocity V indicated by the speed command is maintained at around the predetermined threshold, there may be cases where the direction of the torque of the second motor applied to the load shaft is frequently switched. This causes the direction in which gears of the load shaft mesh with gears of the second motor to be frequently switched. As a result, vibration may occur between the load shaft and the second motor.

RELATED-ART DOCUMENTS

Patent Documents

[Patent Document 1] Japanese Unexamined Patent Application Publication No. 2013-009532

SUMMARY OF THE INVENTION

According to at least one embodiment, a driving apparatus for driving a first motor and a second motor for transmitting a driving force to a same driving shaft based on a voltage command value that has been input is provided. The driving apparatus includes a control unit configured to output a first driving command value for the first motor and a second driving command value for the second motor; and a switching unit configured to switch control patterns used by the control unit from one control pattern to another control pattern when the voltage command value becomes greater than or equal to a predetermined threshold, wherein, when the voltage command value is less than the predetermined threshold, the control unit outputs the first driving command value and the second driving command value based on the one control pattern such that a direction of a torque transmitted from one of the motors becomes different from a driving direction of the driving shaft, and wherein, after the switching unit switches the control patterns from the one control pattern to said another control pattern, the control unit outputs the first driving command value and the second driving command value based on said another control pattern, so as to cause the direction of the torque transmitted from the one of the motors to become same as the driving direction of the driving shaft when the voltage command value is greater than or equal to the predetermined threshold, and so as not to cause the direction of the torque transmitted from the one of the motors to become different from the driving direction of the driving shaft when the voltage command value drops below the predetermined threshold.

DESCRIPTION OF THE PREFERRED EMBODIMENTS

It is a general object of at least one embodiment of the present invention to provide a driving apparatus that allows two motors to drive a same driving shaft so as to eliminate backlash between the two motors and the driving shaft while also suppressing generation of vibration.

In the following, embodiments of the present invention will be described with reference to the accompanying drawings.

First Embodiment

A first embodiment of the present invention will be described below with reference to the accompanying drawings.

(Example of Driving Mechanism that Uses First Motor 101 and Second Motor 102)

Figure 1:
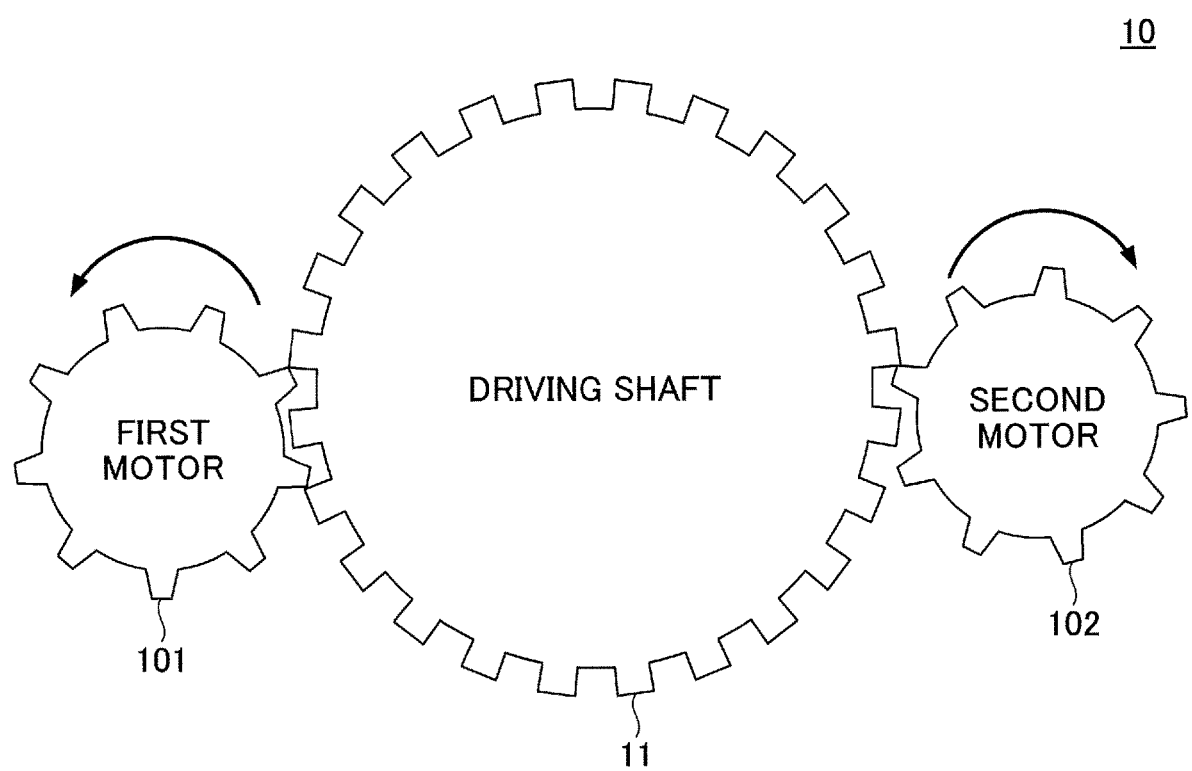
FIG. 1 is a diagram illustrating an example of a driving mechanism that uses a first motor and a second motor according to a first embodiment of the present invention.

FIG. 1 is a diagram illustrating an example of a driving mechanism that uses a first motor and a second motor according to the first embodiment. A driving mechanism 10 illustrated in FIG. 1 includes a first motor 101, a second motor 102, and a driving shaft 11.

The first motor 101 and the second motor 102 are what are known as DC brushless motors. The rotation of an output shaft of each of the first motor 101 and the second motor 102 is controlled by a drive voltage applied from a corresponding driver. In the driving mechanism 10, the first motor 101 and the second motor 102 drive the same driving shaft 11. Examples of the driving shaft 11, if used in an image forming apparatus, include driving shafts of various types of rollers (such as a paper-feeding roller, a conveyance roller, a secondary transfer roller, and a fixing roller).

As illustrated in FIG. 1, the output shaft of each of the first motor 101 and the second motor 102 has gears. The gears mesh with the gear of the driving shaft 11, and rotate together with the output shaft of each of the motors so as to rotatably drive the driving shaft 11.

A rotational direction, a rotational position, and a rotational speed of the output shaft of each of the first motor 101 and the second motor 102 can be controlled by a drive voltage applied from a corresponding driver. For example, by causing the rotational directions of the output shafts of the first motor 101 and the second motor 102 to become different from each other, torques acting in different directions can be applied to the driving shaft 11. As a result, backlash of the driving shaft 11 can be eliminated.

Conversely, by causing the rotational directions of the output shafts of the first motor 101 and the second motor 102 to match each other, torques acting in the same direction can be applied to the driving shaft 11. As a result, the driving shaft 11 can be rotatably driven by a high torque (a combined torque of an output torque of the first motor 101 and an output torque of the second motor 102).

(Configuration of Driving System 100)

Figure 2:
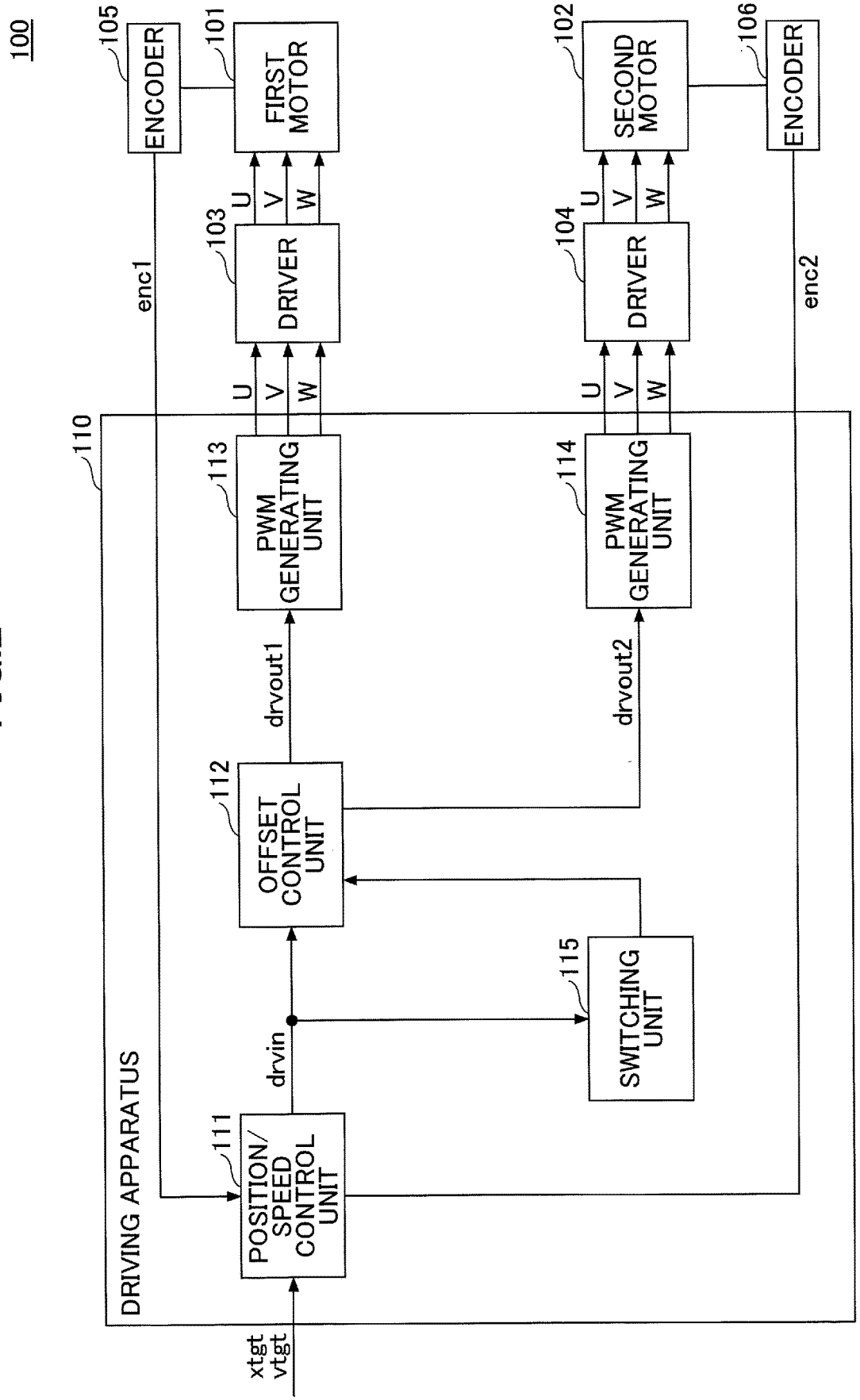
FIG. 2 is a diagram illustrating a configuration of a driving system according to the first embodiment of the present invention.

FIG. 2 is a diagram illustrating a configuration of a driving system 100 according to the first embodiment of the present invention. As illustrated in FIG. 2, the driving system 100 includes, in addition to the first motor 101 and the second motor 102 described in FIG. 1, a driving apparatus 110, a driver 103, a driver 104, an encoder 105, and an encoder 106.

The driving apparatus 110 includes a position/speed control unit 111, an offset control unit 112, a PWM (pulse-width modulation) generating unit 113, a PWM generating unit 114, and a switching unit 115. The driving apparatus 110 may execute all functions by using a circuit, and may also execute some of the functions by using software (a CPU). The driving apparatus 110 may be executed by a plurality of circuits or a plurality of software.

The color wheel controller 113 controls rotation of the color wheel 121. The color wheel controller 113 is, for example, an electronic circuit.

The lamp controller 114 controls the light source lamp 117. For example, the lamp controller 114 controls power supply to the light source lamp 117 in order to turn on and off the light source lamp 117. The lamp controller 114 is, for example, an electronic circuit.

The power supply unit 115 controls power supply to the projector 1. The power supply unit 115 is, for example, an electronic circuit. The power supply unit 115 may be controlled by the system controller 106.

The lens 116 includes, for example, optical components such as a plurality of projection lenses and mirrors. The lens 116 enlarges an image generated by the DMD 119 and projects the image onto the screen S.

<Example of Optical Engine>

A configuration example of an optical engine 25 will be described below.

Figure 3:
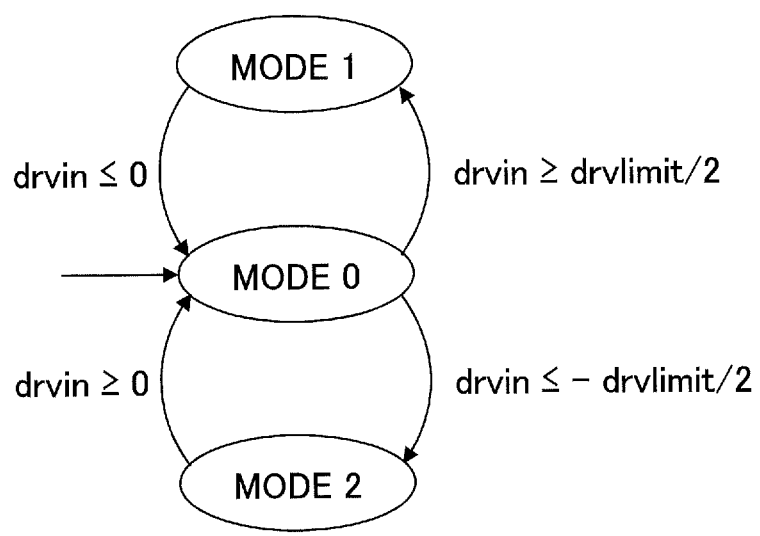
FIG. 3 is a diagram illustrating mode transition of an offset control unit according to the first embodiment of the present invention.

FIG. 3 is a perspective view of the optical engine 25 according to the embodiment. In the illustrated example, the optical engine 25 is provided inside the projector 1. The optical engine includes a light source 30, an illumination optical system unit 40, an image forming unit 50, and a projection optical system unit 60.

In the illustrated example, the light source 30 is provided on the side surface of the illumination optical system unit 40, and emits light in the X2 direction. Next, the illumination optical system unit 40 guides the light emitted from the light source 30 to the image forming unit 50 located at the lower part. Subsequently, the image forming unit 50 uses the light guided by the illumination optical system unit 40 to generate a projection image. Further, the projection optical system unit 60 is provided above the illumination optical system unit 40, and projects the projection image generated by the image forming unit 50 to the outside of the projector 1.

In the illustrated example, the optical engine 25 projects an image in the upward direction by using the light emitted from the light source 30; however, the direction in which the image is projected is not limited to the upward direction. For example, the image may be projected in the horizontal direction.

suppressing generation of vibration.

The offset control unit 112 of the present embodiment performs offset control of the voltage command value drvin based on first through third control patterns.

For example, when the voltage command value drvin is greater than 0 to less than drvlimit/2 (a predetermined threshold), the offset control unit 112 controls the driving command values drvout1 and drvout2 based on the first control pattern (see FIG. 4), such that the direction of a torque transmitted from the first motor 101 becomes different from the driving direction of the driving shaft 11.

Figure 5:
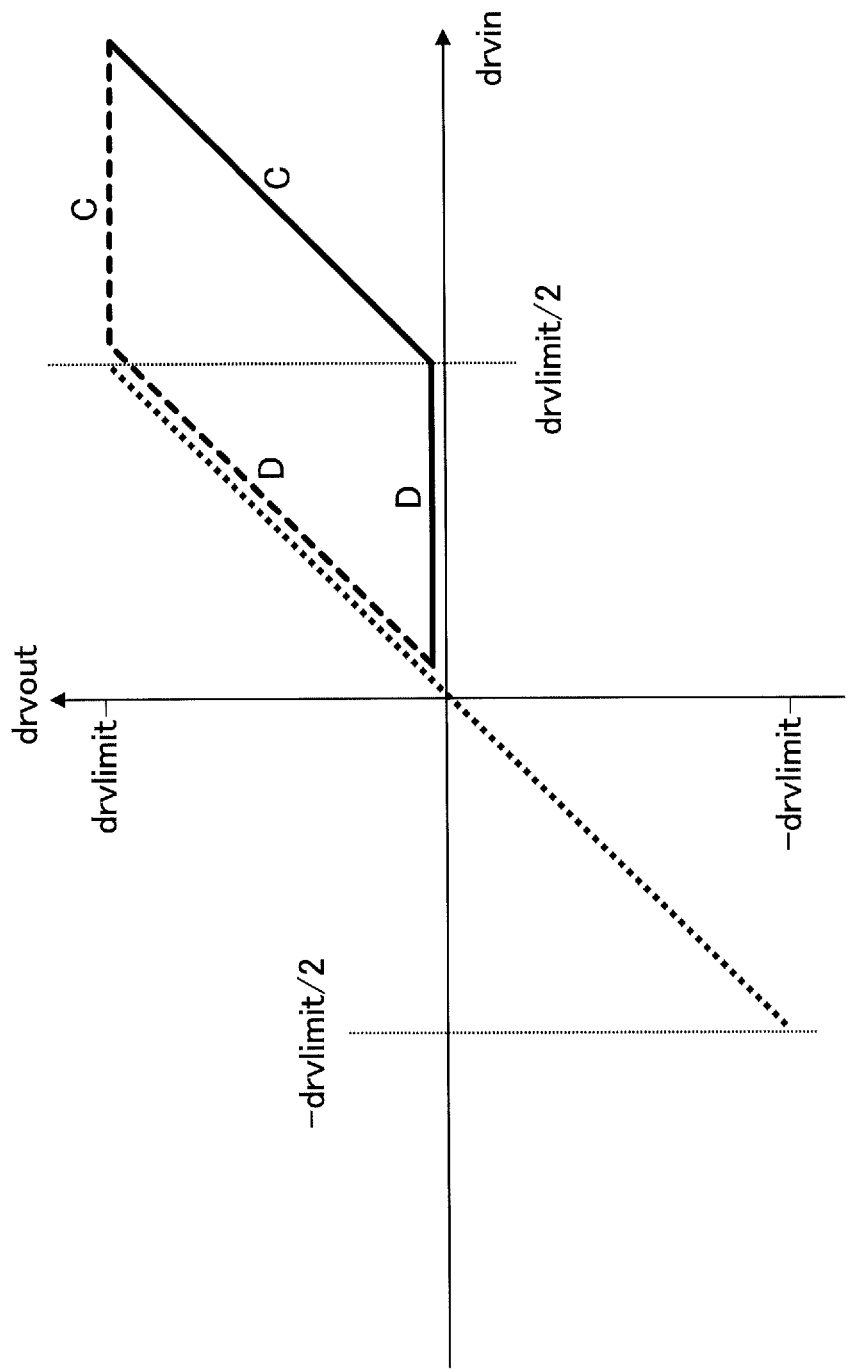
FIG. 5 is a graph illustrating a second control pattern used by the offset control unit to perform offset control according to the first embodiment of the present invention.

When the voltage command value drvin becomes greater than or equal to drvlimit/2 (the predetermined threshold), the switching unit 115 switches the control patterns used by the offset control unit 112 from the first control pattern to the second control pattern (see FIG. 5).

In this case, the offset control unit 112 controls the driving command values drvout1 and drvout2 based on the second control pattern, such that the direction of the torque transmitted from the first motor 101 becomes the same as the driving direction of the driving shaft 11 when the voltage command value drvin is greater than or equal to drvlimit/2.

Also, the offset control unit 112 controls the driving command values drvout1 and drvout2 based on the second control pattern, such that an output torque of the first motor 101 becomes 0 when the voltage command value drvin is less than drvlimit/2. This prevents the direction of the torque transmitted from the first motor 101 from becoming different from the driving direction of the driving shaft 11.

Further, the offset control unit 112 controls the driving command values drvout1 and drvout2 based on the first control pattern (see FIG. 4) when the voltage command value drvin is greater than −drvlimit/2 to less than 0, such that the direction of a torque transmitted from the second motor 102 becomes different from the driving direction of the driving shaft 11.

Figure 6:
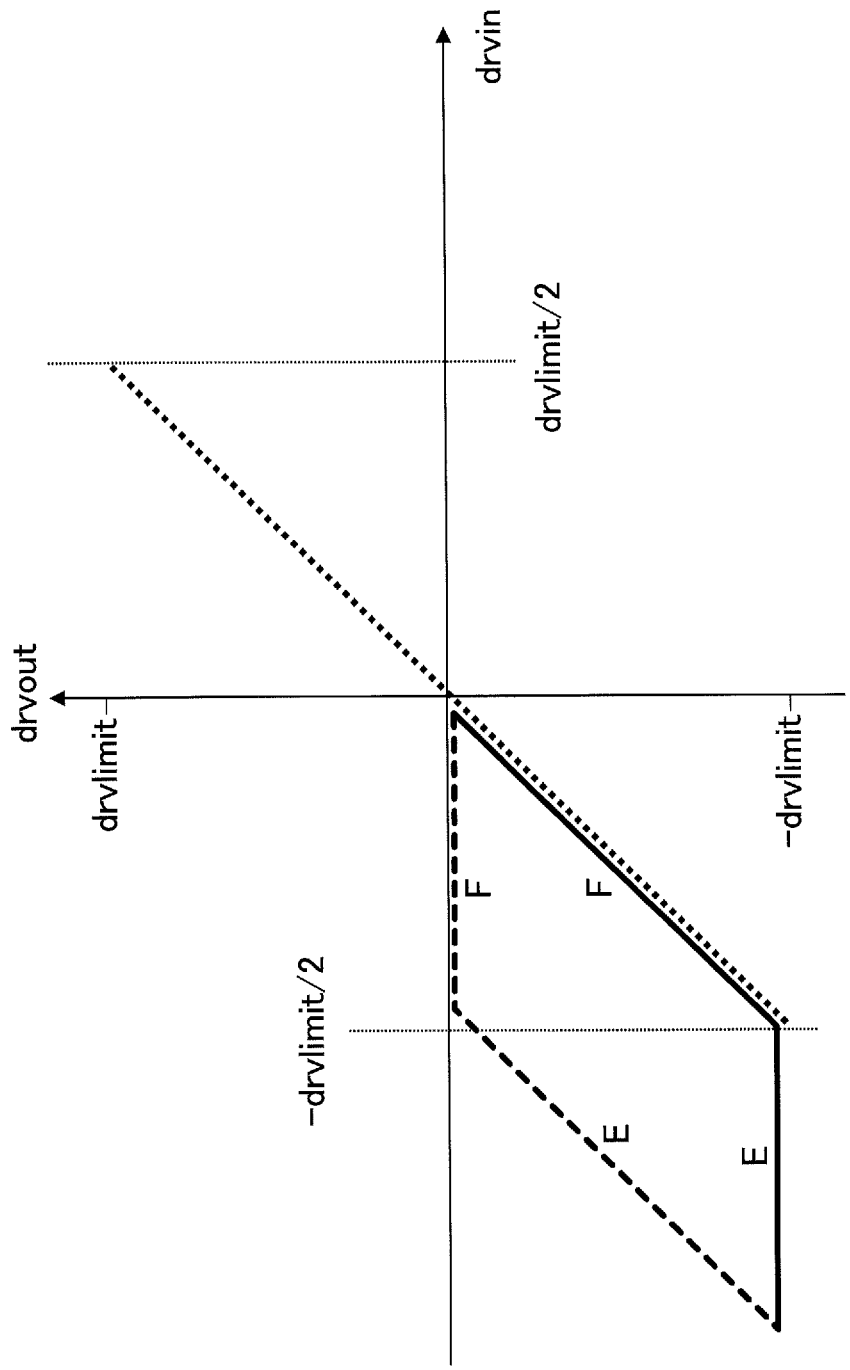
FIG. 6 is a graph illustrating a third control pattern used by the offset control unit to perform offset control according to the first embodiment of the present invention.

When the voltage command value drvin becomes less than or equal to −drvlimit/2, the switching unit 115 switches the control patterns used by the offset control unit 112 from the first control pattern to the third control pattern (see FIG. 6).

In this case, the offset control unit 112 controls the driving command values drvout1 and drvout2 based on the third control pattern, such that the direction of the torque transmitted from the second motor 102 becomes the same as the driving direction of the driving shaft 11 when the voltage command value drvin is less than or equal to drvlimit/2.

Also, the offset control unit 112 controls the driving command values drvout1 and drvout2 based on the third control pattern, such that an output torque of the second motor 102 becomes 0 when the voltage command value drvin is greater than or equal to −drvlimit/2. This prevents the direction of the torque transmitted from the second motor 102 from becoming different from the driving direction of the driving shaft 11.

The PWM generating unit 113 generates a PWM signal having a duty cycle corresponding to the driving command value drvout1 for the first motor 101, which has been output from the offset control unit 112, and supplies the generated PWM signal to the driver 103.

The PWM generating unit 114 generates a PWM signal having a duty cycle corresponding to the driving command value drvout2 for the second motor 102, which has been output from the offset control unit 112, and supplies the generated PWM signal to the driver 104.

The switching unit 115 switches the control patterns used by the offset control unit 112. For example, when the voltage command value drvin become greater than or equal to drvlimit/2 (the predetermined threshold), the switching unit 115 switches the offset control unit 112 from "mode 0" to "mode 1". Accordingly, the switching unit 115 switches the control patterns used by the offset control unit 112 from the first control pattern (see FIG. 4) to the second control pattern (see FIG. 5). Subsequently, when the voltage command value drvin becomes 0, the switching unit 115 switches the offset control unit 112 from "mode 1" to "mode 0". Accordingly, the switching unit 115 switches the control patterns used by the offset control unit 112 from the second control pattern to the first control pattern.

Further, for example, when the voltage command value drvin becomes less than or equal to −drvlimit/2 (the predetermined threshold), the switching unit 115 switches the offset control unit 112 from "mode 0" to "mode 2". Accordingly, the switching unit 115 switches the control patterns used by the offset control unit 112 from the first control pattern (see FIG. 4) to the third control pattern (see FIG. 6). Subsequently, when the voltage command value drvin becomes 0, the switching unit 115 switches the offset control unit 112 from "mode 2" to "mode 0". Accordingly, the switching unit 115 switches the control patterns used by the offset control unit 112 from the third control pattern to the first control pattern.

The driver 103 operates in accordance with the PWM signal supplied from the PWM generating unit 113, thereby applying drive voltages to U, V, and W phases of the first motor 101. As a result, the first motor 101 rotates. The driver 103 may be provided inside the first motor 101 or may be provided outside the first motor 101.

The driver 104 operates in accordance with the PWM signal supplied from the PWM generating unit 114, thereby applying drive voltages to U, V, and W phases of the second motor 102. As a result, the second motor 102 rotates. The driver 104 may be provided inside the second motor 102 or may be provided outside the second motor 102.

The encoder 105 is provided on the output shaft of the first motor 101, and outputs an encoder signal enc1 that is a pulse signal corresponding to the rotation of the output shaft of the first motor 101. The encoder signal enc1 is supplied to the position/speed control unit 111 of the driving apparatus 110, and is used by the position/speed control unit 111 to perform PID control on the position and the speed of the first motor 101.

The encoder 106 is provided on the output shaft of the second motor 102, and outputs an encoder signal enc2 that is a pulse signal corresponding to the rotation of the output shaft of the second motor 102. The encoder signal enc2 is supplied to the position/speed control unit 111 of the driving apparatus 110, and is used by the position/speed control unit 111 to perform PID control on the position and the speed of the second motor 102.

(Offset Control Performed by Offset Control Unit 112)

Next, referring to FIG. 3 through FIG. 6, offset control performed by the offset control unit 112 will be described. The offset control is to eliminate backlash between the driving shaft 11 and the two motors 101 and 102 by correcting a voltage command value for each of the first motor 101 and the second motor 102 when driving the two motor 101 and 102, and is performed by the offset control unit 112 (see FIG. 2) of the driving apparatus 110.

(Mode Transition of Offset Control Unit 112)

FIG. 3 is a diagram illustrating mode transition of the offset control unit 112 according to the first embodiment of the present invention. As illustrated in FIG. 3, the offset control unit 112 includes "mode 0", "mode 1", and "mode 2" as operating modes.

First, the offset control unit 112 operates in "mode 0". "Mode 0" is a mode in which offset control is performed based on the first control pattern (see FIG. 4). The offset control unit 112 operates in "mode 0" while the voltage command value drvin is greater than −drvlimit/2 to less than drvlimit/2.

When the voltage command value drvin becomes greater than or equal to drvlimit/2, the offset control unit 112 switches the offset control unit 112 from "mode 0" to "mode 1". "Mode 1" is a mode in which offset control is performed based on the second control pattern (see FIG. 5). The offset control unit 112 operates in "mode 1" while the voltage command value drvin is >0. When the voltage command value drvin becomes 0, the switching unit 115 switches the offset control unit 112 from "mode 1" to "mode 0".

When the voltage command value drvin becomes less than or equal to −drvlimit/2, the switching unit 115 switches the offset control unit 112 from "mode 0" to "mode 2" (see FIG. 6). "Mode 2" is a mode in which offset control is performed based on the third control pattern (see FIG. 6). The offset control unit 112 operates in "mode 2" while the voltage command value drvin is <0. When the voltage command value drvin becomes 0, the switching unit 115 switches the offset control unit 112 from "mode 2" to "mode 0".

Note that "one control pattern" described in the claims corresponds to the first control pattern of the present embodiment. Also, "another control pattern" described in the claims corresponds to the second control pattern of the present embodiment when the voltage command value drvin is >0 and corresponds to the third control pattern when the voltage command value drvin is <0.

(First Control Pattern)

Figure 4:
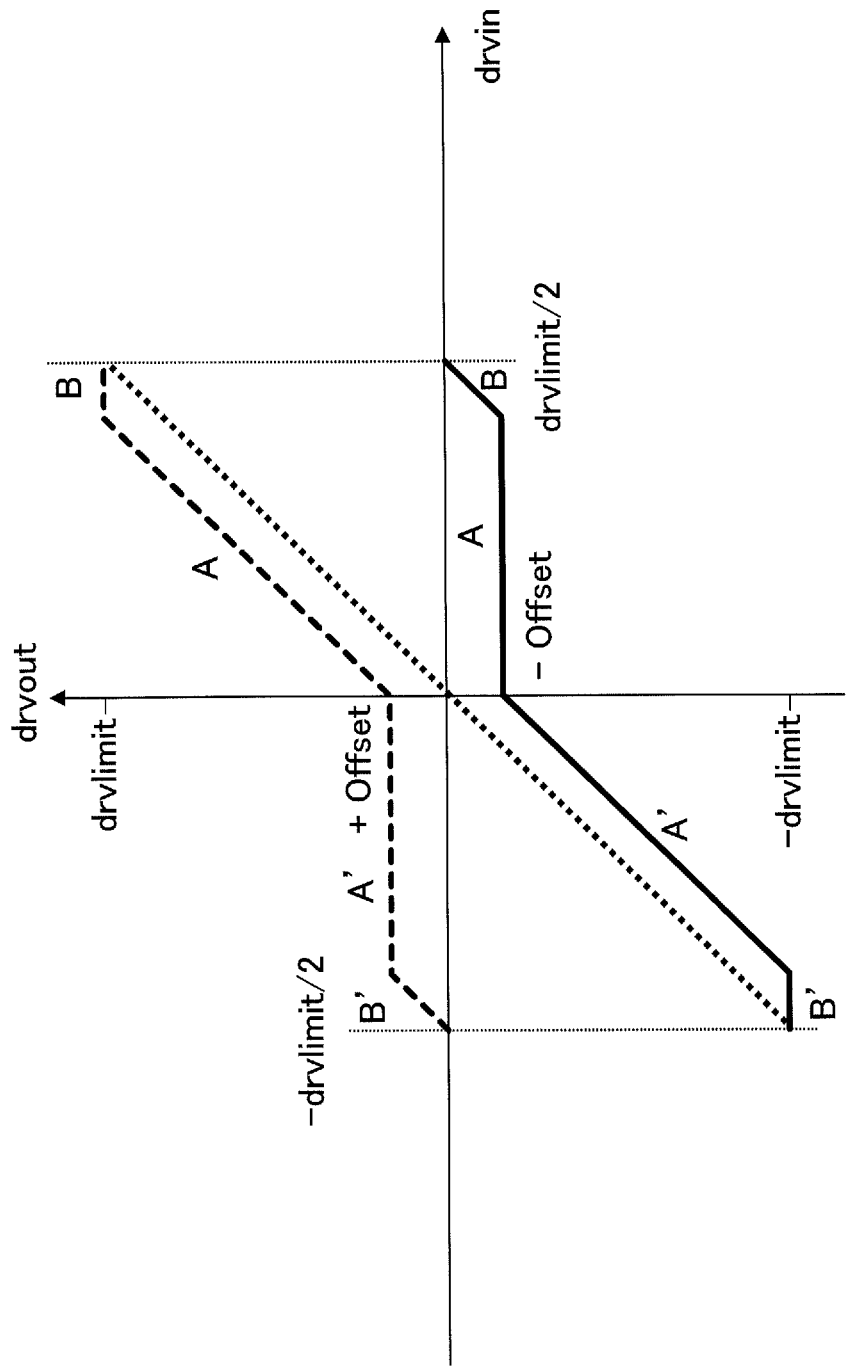
FIG. 4 is a graph illustrating a first control pattern used by the offset control unit to perform offset control according to the first embodiment of the present invention.

FIG. 4 is a graph illustrating the first control pattern used by the offset control unit 112 to perform offset control according to the first embodiment of the present invention. As illustrated in FIG. 4, the first control pattern is used by the offset control unit 112 (mode 0) to perform offset control when the voltage command value drvin is greater than −drvlimit/2 to less than drvlimit/2.

In each of the graphs of FIG. 4 through FIG. 6, a horizontal axis represents a voltage command value drvin before correction is performed by means of offset control, and a vertical axis represents a driving command value drvout after correction is performed by means of offset control. Also, in each of the graphs of FIG. 4 through FIG. 6, a continuous line represents a relationship between the voltage command value drvin and the driving command value drvout1 of the first motor 101. A dashed line represents a relationship between the voltage command value drvin and the driving command value drvout 2 of the second motor 102. Also, in each of the graphs of FIG. 4 through FIG. 6, a dotted line represents a relationship between the voltage command value drvin and the driving command value drvout if offset control is not performed, where the voltage command value drvin is equal to the driving command value drvout.

(When Voltage Command Value Drvin is 0)

In the first control pattern, when the voltage command value drvin is 0, the offset control unit 112 outputs the driving command value drvout1 such that a voltage value of the first motor 101 is set to a negative offset (−offset) voltage, and thus the direction of the torque transmitted from the first motor 101 becomes opposite to the driving direction of the driving shaft 11. At the same time, the offset control unit 112 outputs the driving command value drvout 2 such that a voltage value of the second motor 102 is set to a positive offset (+offset) voltage, and thus the direction of the torque transmitted from the second motor 102 becomes the same as the driving direction of the driving shaft 11. Accordingly, driving forces acting in opposite directions are applied from the two motors 101 and 102 to the driving shaft 11, thereby eliminating backlash between the driving shaft 11 and the two motors 101 and 102. Note that the negative and positive offset voltages are intended to eliminate gaps between gears, and no external load is applied. Thus, approximately 5% of drive voltages is sufficient.

(When Voltage Command Value Drvin is Greater than 0)

According to the first control pattern, when the voltage command value drvin is greater than 0 as indicated by A in FIG. 4, the offset control unit 112 makes the drive voltage of the first motor 101 constant at the −offset voltage, while controlling the driving command value drvout 2 of the second motor 102 such that the drive voltage of the second motor 102 gradually increases from the +offset voltage. Accordingly, a torque (a combined torque of an output torque of the first motor 101 and an output torque of the second motor 102) acting in the same direction as the driving direction of the driving shaft 11 and applied to the driving shaft 11 can be gradually increased while maintaining a state in which backlash is eliminated.

Next, as indicated by B in FIG. 4, when the drive voltage of the second motor 102 reaches the drvlimit, namely when the output of the second motor 102 reaches a limit value, the offset control unit 112 controls the driving command value drvout 2 of the second motor 102 such that the drive voltage of the second motor 102 is made constant at the drvlimit.

In this state, the offset control unit 112 controls the driving command value drvout1 of the first motor 101 such that the drive voltage of the first motor 101 gradually increases from the −offset voltage. Accordingly, a torque (a combined torque of an output torque of the first motor 101 and an output torque of the second motor 102) acting in the same direction as the driving direction of the driving shaft 11 and applied to the driving shaft 11 can be gradually increased.

When the voltage command value drvin reaches drvlimit/2 (namely, when the drive voltage of the first motor 101 switches from negative to positive), the switching unit 115 switches the offset control unit 112 to "mode 1". In "mode 1", the offset control unit 112 performs offset control based on the second control pattern illustrated in FIG. 5.

(When Voltage Command Value Drvin is Less than 0)

Also, according to the first control pattern, when the voltage command value drvin is less than 0 as indicated by A' in FIG. 4, the offset control unit 112 makes the drive voltage of the second motor 102 constant at the +offset voltage, while controlling the driving command value drvout1 of the first motor 101 such that the drive voltage of the first motor 101 gradually decreases from the −offset voltage. Accordingly, a torque (a combined torque of an output torque of the first motor 101 and an output torque of the second motor 102) acting in the same direction as the driving direction of the driving shaft 11 and applied to the driving shaft 11 can be gradually increased while maintaining a state in which backlash is eliminated.

Next, as indicated by B' in FIG. 4, when the drive voltage of the first motor 101 reaches the −drvlimit, namely when the output of the first motor 101 reaching a limit value, the offset control unit 112 controls the driving command value drvout1 of the first motor 101 such that the drive voltage of the first motor 101 is made constant at the −drvlimit.

At this time, the offset control unit 112 controls the driving command value drvout 2 of the second motor 102 such that the drive voltage of the second motor 102 gradually decreases from the offset voltage. Accordingly, a torque (a combined torque of an output torque of the first motor 101 and an output torque of the second motor 102) acting in the same direction as the driving direction of the driving shaft 11 and applied to the driving shaft 11 can be gradually increased.

When the voltage command value drvin becomes less than or equal to −drvlimit/2 (namely, when the drive voltage of the second motor 102 switches from positive to negative), the switching unit 115 switches the offset control unit 112 to "mode 2". In "mode 2", the offset control unit 112 performs offset control based on the third control pattern illustrated in FIG. 6.

(Second Control Pattern)

FIG. 5 is a graph illustrating the second control pattern used by the offset control unit 112 to perform offset control according to the first embodiment of the present invention. The second control pattern is used by the offset control unit 112 (mode 1) to perform offset control when the voltage command value drvin reaches drvlimit/2.

(When Voltage Command Value Drvin is Greater than or Equal to Drvlimit/2)

According to the second control pattern, when the voltage command value drvin is greater than or equal to drvlimit/2 as indicated by C in FIG. 5, the offset control unit 112 makes the drive voltage of the second motor 102 constant at the drvlimit, while controlling the driving command value drvout1 of the first motor 101 such that the drive voltage of the first motor 101 gradually increases from 0. Accordingly, a torque (a combined torque of an output torque of the first motor 101 and an output torque of the second motor 102) acting in the same direction as the driving direction of the driving shaft 11 and applied to the driving shaft 11 can be gradually increased.

Next, when the drive voltages of the two motors 101 and 102 both reach the drvlimit, namely when the outputs of the two motors 101 and 102 both reach the limit value, the offset control unit 112 controls the driving command values drvout1 and drvout2 of the two motors 101 and 102 such that the drive voltages of the two motors 101 and 102 are maintained constantly at the drvlimit.

(When Voltage Command Value Drvin is Less than Drvlimit/2)

In the second control pattern, differently from the first control pattern, when the voltage command value drvin is less than drvlimit/2, an offset torque in the negative direction of the first motor 101 is not applied, as indicated by D in FIG. 5. In the second control pattern, even if the voltage command value drvin becomes less than drvlimit/2, the output of the first motor 101 is made constant at 0. This prevents the direction of the torque transmitted from the first motor 101 from becoming opposite to the driving direction of the driving shaft 11. Accordingly, it is possible to eliminate backlash between the driving shaft 11 and the two motors 101 and 102, while also suppressing generation of vibration.

In the second control pattern, when the voltage command value drvin is less than drvlimit/2, as indicated by D in FIG. 5, an offset torque in the positive direction of the second motor 102 is also not applied at the time when the offset torque in the negative direction of the first motor 101 is not applied. Accordingly, in the second control pattern, when the voltage command value drvin becomes 0, the outputs of the first motor 101 and the second motor 102 can both become 0.

Also, when the voltage command value drvin becomes 0 while the second control pattern is used, the switching unit 115 switches from "mode 1" to "mode 0". As a result, the second control pattern used by the control unit 112 is switched to the first control pattern illustrated in FIG. 4. At this time, no drive voltage is applied to the first motor 101 and the second motor 102. In this state, negative and positive offset voltages are applied to the first motor 101 and the second motor 102. Instead of applying the full negative and positive offset voltages at once, the negative and positive offset voltages are applied gradually until the first motor 101 and the second motor 102 reach the "−offset" and the "+offset" voltages. Accordingly, it is possible to prevent driving forces of the two motors 101 and 102 from being rapidly changed.

(Third Control Pattern)

FIG. 6 is a graph illustrating the third control pattern used by the offset control unit 112 to perform offset control according to the first embodiment of the present invention. The third control pattern illustrated in FIG. 6 is used by the offset control unit 112 (mode 2) to perform offset control when the voltage command value drvin reaches −drvlimit/2.

(When Voltage Command Value Drvin is Less than or Equal to −Drvlimit/2)

According to the third control pattern, when the voltage command value drvin is less than or equal to −drvlimit/2 as indicated by E in FIG. 6, the offset control unit 112 makes the drive voltage of the first motor 101 constant at the −drvlimit, while controlling the driving command value drvout 2 of the second motor 102 such that the drive voltage of the second motor 102 gradually decreases from 0. Accordingly, a torque (a combined torque of an output torque of the first motor 101 and an output torque of the second motor 102) acting in the same direction as the driving direction of the driving shaft 11 and applied to the driving shaft 11 can be gradually increased.

When the drive voltages of the two motors 101 and 102 both reach the −drvlimit, namely when the outputs of the two motors 101 and 102 both reaching the limit value, the offset control unit 112 controls the driving command values drvout1 and drvout2 of the two motors 101 and 102 such that the drive voltages of the two motors 101 and 102 are made constant at the −drvlimit.

(When Voltage Command Value Drvin is Greater than −Drvlimit/2)

In the third control pattern, differently from the first control pattern, when the voltage command value drvin is greater than −drvlimit/2, an offset torque in the positive direction of the second motor 102 is not applied as indicated by F in FIG. 6. Namely, in the third control pattern, even if the voltage command value drvin exceeds −drvlimit/2, the output of the second motor 102 is made constant at 0. This prevents the direction of the torque transmitted from the second motor 102 from becoming opposite to the driving direction of the driving shaft 11. Accordingly, it is possible to eliminate backlash between the driving shaft 11 and the two motors 101 and 102, while also suppressing generation of vibration.

In the third control pattern, when the voltage command value drvin is greater than drvlimit/2, as indicated by F in FIG. 6, an offset torque in the negative direction of the first motor 101 is also not applied at the time when the offset torque in the positive direction of the second motor 102 is not applied. Accordingly, in the third control pattern, when the voltage command value drvin becomes 0, the outputs of the first motor 101 and the second motor 102 can both become 0.

Also, when the voltage command value drvin becomes 0 while the third control pattern is used, the switching unit 115 switches from "mode 2" to "mode 0". As a result, the third control pattern used by the control unit 112 is switched to the first control pattern illustrated in FIG. 4. At this time, no drive voltage is applied to the first motor 101 and the second motor 102. In this state, negative and positive offset voltages are applied to the first motor 101 and the second motor 102. Instead of applying the full negative and positive offset voltages at once, the negative and positive offset voltages are applied gradually until the first motor 101 and the second motor 102 reach the "−offset" and the "offset" voltages. Accordingly, it is possible to prevent driving forces of the two motors 101 and 102 from being rapidly changed.

As described above, according to the driving system 100 of the first embodiment, when the voltage command value drvin becomes greater than or equal to drvlimit/2, the control patterns used by the offset control unit 112 are switched from the first control pattern to the second control pattern. Accordingly, even if the voltage command value drvin becomes less than drvlimit/2 thereafter, it is possible to prevent the direction of the torque transmitted from the first motor 101 from becoming different from the driving direction of the driving shaft 11. Thus, according to the driving system 100 of the first embodiment, it is possible to eliminate backlash between the driving shaft 11 and the two motors 101 and 102, while also suppressing generation of vibration.

Also, according to the driving system 100 of the first embodiment, when the voltage command value drvin becomes less than or equal to −drvlimit/2, the control pattern used by the offset control unit 112 is switched from the first control pattern to the third control pattern. Accordingly, even if the voltage command value drvin becomes less than −drvlimit/2 thereafter, it is possible to prevent the direction of the torque transmitted from the second motor 102 from becoming different from the driving direction of the driving shaft 11. Thus, according to the driving system 100 of the first embodiment, it is possible to eliminate backlash between the driving shaft 11 and the two motors 101 and 102, while also suppressing generation of vibration.

Second Embodiment

Next, a second embodiment of the present invention will be described with reference to FIG. 7 through FIG. 9.
(Configuration of Driving System 100')

Figure 7:
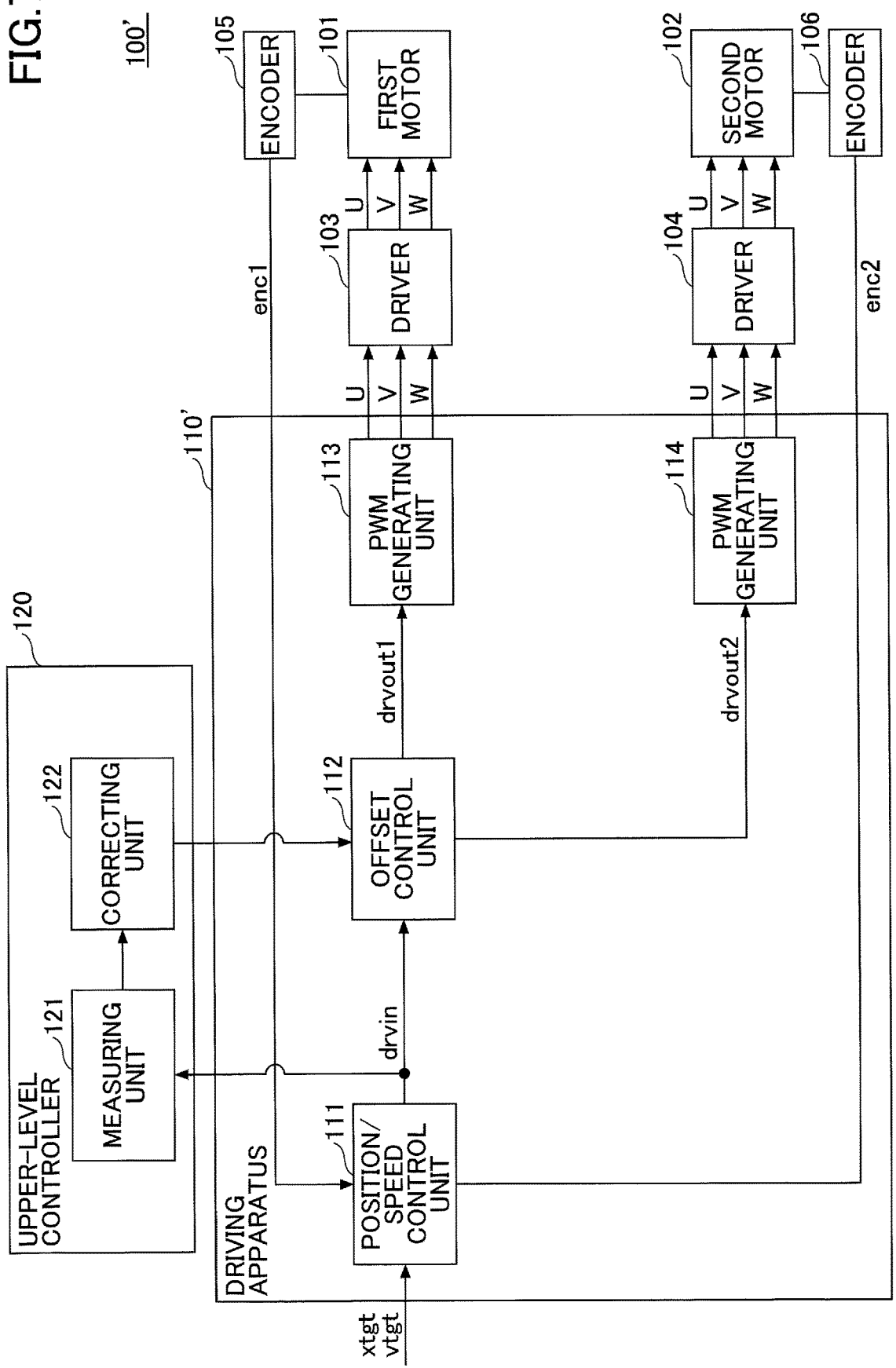
FIG. 7 is a diagram illustrating a configuration of a driving system according to a second embodiment of the present invention.

FIG. 7 is a diagram illustrating a configuration of a driving system 100' according to the second embodiment of the present invention. The driving system 100' of the second embodiment illustrated in FIG. 7 includes a driving apparatus 110' instead of the driving apparatus 110. The driving apparatus 110' differs from the driving apparatus 110 in that the switching unit 115 is not included. Instead of the switching unit 115, a measuring unit 121 and a correcting unit 122 are included in an upper-level controller 120 of the driving system 100'.

The measuring unit 121 measures a range R of a voltage command value drvin within a predetermined measurement period of time. For example, while the voltage command value drvin is maintained at around a predetermined threshold th, the measuring unit 121 measures a range R of a voltage command value drvin within a predetermined measurement period of time. The predetermined measurement period of time is a period of time from a start time to an end time of a repeatedly-performed sequence. Examples of timing at which to measure a range R includes a start time of a repeatedly-performed sequence.

When a predetermined condition is met, the correcting unit 122 corrects a control pattern used by the offset control unit 112. In the present embodiment, when a range R of a voltage command value drvin is measured by the measuring unit 121, the correcting unit 122 corrects a control pattern used by the offset control unit 112 such that the predetermined threshold th falls outside the range R.
(Control Pattern Before Corrected by Correcting Unit 122)

Figure 8:
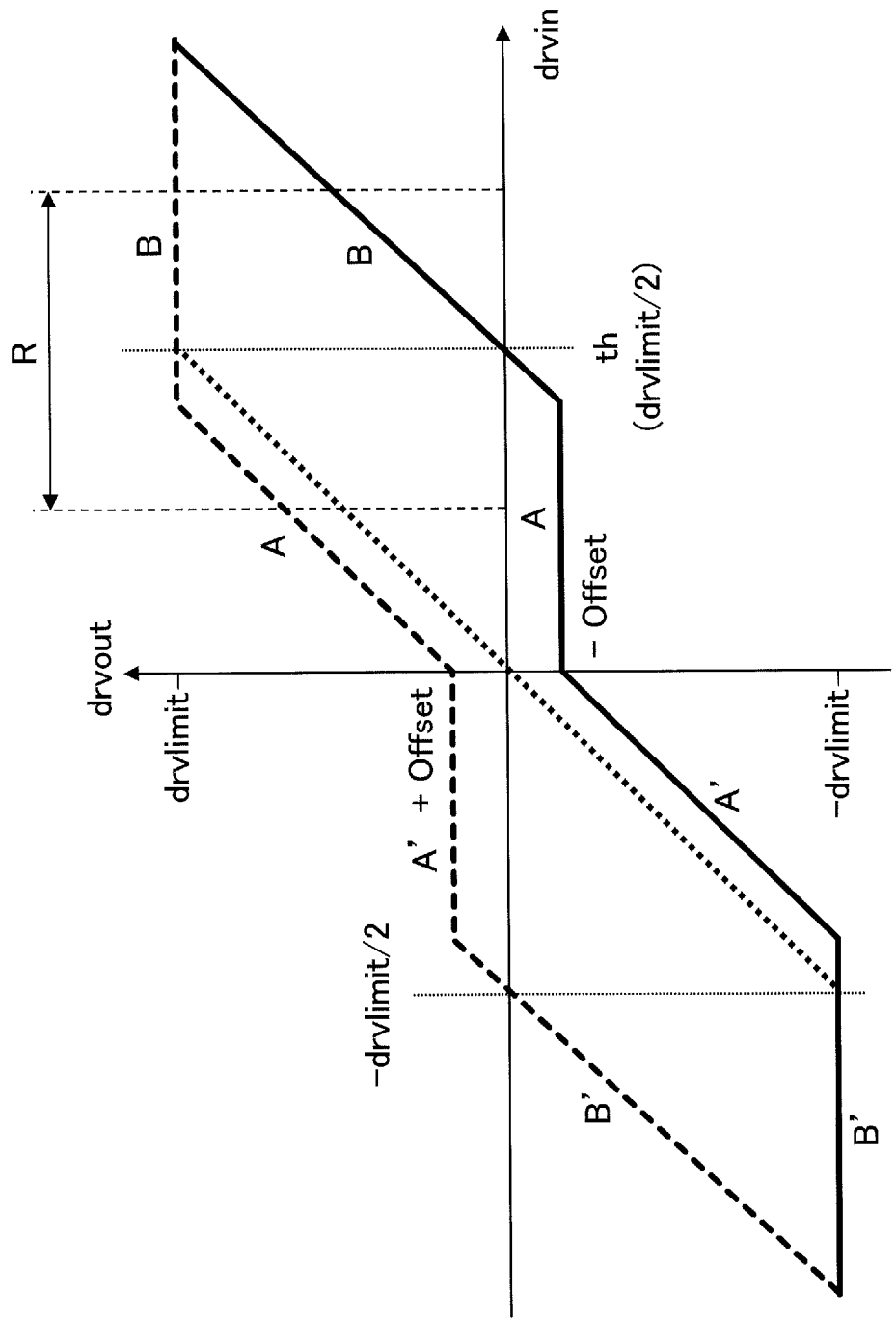
FIG. 8 is a graph illustrating a control pattern (a control pattern before corrected by a correcting unit) used by an offset control unit to perform offset control according to the second embodiment of the present invention.

FIG. 8 is a graph illustrating a control pattern (a control pattern before corrected by the correcting unit 122) used by the offset control unit 112 to perform offset control according to the second embodiment of the present invention.

(When Voltage Command Value Drvin is 0)

According to the control pattern illustrated in FIG. 8, when the voltage command value drvin is 0, the offset control unit 112 outputs a driving command value drvout1 such that a voltage value of the first motor 101 is set to a negative offset (−offset) voltage, and thus the direction of a torque transmitted from the first motor 101 becomes opposite to the driving direction of the driving shaft 11. At the same time, the offset control unit 11 outputs a driving command value drvout 2 such that a voltage value of the second motor 102 is set to a positive offset (+offset) voltage, and thus the direction of a torque transmitted from the second motor 102 becomes the same as the driving direction of the driving shaft 11. Accordingly, driving forces acting in opposite directions are applied from the two motors 101 and 102 to the driving shaft 11, thereby eliminating backlash between the driving shaft 11 and the two motors 101 and 102.
(When Voltage Command Value Drvin is Greater than 0)

According to the control pattern illustrated in FIG. 8, when the voltage command value drvin is greater than 0 as indicated by A in FIG. 8, the offset control unit 112 makes a drive voltage of the first motor 101 constant at the −offset voltage, while controlling the driving command value drvout 2 of the second motor 102 such that a drive voltage of the second motor 102 gradually increases from the +offset voltage. Accordingly, a torque (a combined torque of an output torque of the first motor 101 and an output torque of the second motor 102) acting in the same direction as the driving direction of the driving shaft 11 and applied to the driving shaft 11 can be gradually increased while maintaining a state in which backlash is eliminated.

Next, as indicated by B in FIG. 8, upon the drive voltage of the second motor 102 reaching the drvlimit, namely upon the output of the second motor 102 reaching a limit value, the offset control unit 112 controls the driving command value drvout 2 of the second motor 102 such that the drive voltage of the second motor 102 is made constant at the drvlimit.

At this time, the offset control unit 112 controls the driving command value drvout1 of the first motor 101 such that the drive voltage of the first motor 101 gradually increases from the −offset voltage. Accordingly, a torque (a combined torque of an output torque of the first motor 101 and an output torque of the second motor 102) acting in the same direction as the driving direction of the driving shaft 11 and applied to the driving shaft 11 can be gradually increased.

When the voltage command value drvin reaches drvlimit/2, the drive voltage of the first motor 101 switches from negative to positive. Namely, the direction of the torque transmitted from the first motor 101 is switched to the same direction as the driving direction of the driving shaft 11.

Further, when the drive voltages of the two motors 101 and 102 both reach the drvlimit, namely when the outputs of the motor 101 and the motor 102 both reach the limit value, the offset control unit 112 controls the driving command values drvout1 and drvout2 of the two motors 101 and 102 such that the drive voltages of the two motors 101 and 102 are made constant at the drvlimit.
(When Voltage Command Value Drvin is Less than 0)

According to the control pattern illustrated in FIG. 8, when the voltage command value drvin is less than 0 as indicated by A' in FIG. 8, the offset control unit 112 makes the drive voltage of the second motor 102 constant at the +offset voltage, while controlling the driving command value drvout1 of the first motor 101 such that the drive voltage of the first motor 101 gradually decreases from the −offset voltage. Accordingly, a torque (a combined torque of an output torque of the first motor 101 and an output torque of the second motor 102) acting in the same direction as the driving direction of the driving shaft 11 and applied to the driving shaft 11 can be gradually increased while maintaining a state in which backlash is eliminated.

Next, as indicated by B' in FIG. 8, when the drive voltage of the first motor 101 reaches the −drvlimit, namely when the output of the first motor 101 reaches a limit value, the offset control unit 112 controls the driving command value drvout1 of the first motor 101 such that the drive voltage of the first motor 101 is made constant at the −drvlimit.

In this state, the offset control unit 112 controls the driving command value drvout 2 of the second motor 102 such that the drive voltage of the second motor 102 gradually decreases from the +offset voltage. Accordingly, a torque (a combined torque of an output torque of the first motor 101 and an output torque of the second motor 102) acting in the same direction as the driving direction of the driving shaft 11 and applied to the driving shaft 11 can be gradually increased.

When the voltage command value drvin reaches −drvlimit/2, the drive voltage of the second motor 102 is switched from positive to negative. Namely, the direction of a torque transmitted from the second motor 102 is switched to the same direction as the driving direction of the driving shaft 11.

Further, when the drive voltages of the two motors 101 and 102 both reach the −drvlimit, namely when the output of the motor 101 and the output of the motor 102 both reach the limit value, the offset control unit 112 controls the driving command values drvout1 and drvout2 of the two motors 101 and 102 such that the drive voltages of the two motors 101 and 102 are both made constant at the −drvlimit (Control Pattern After Corrected by Correcting Unit 122)

Figure 9:
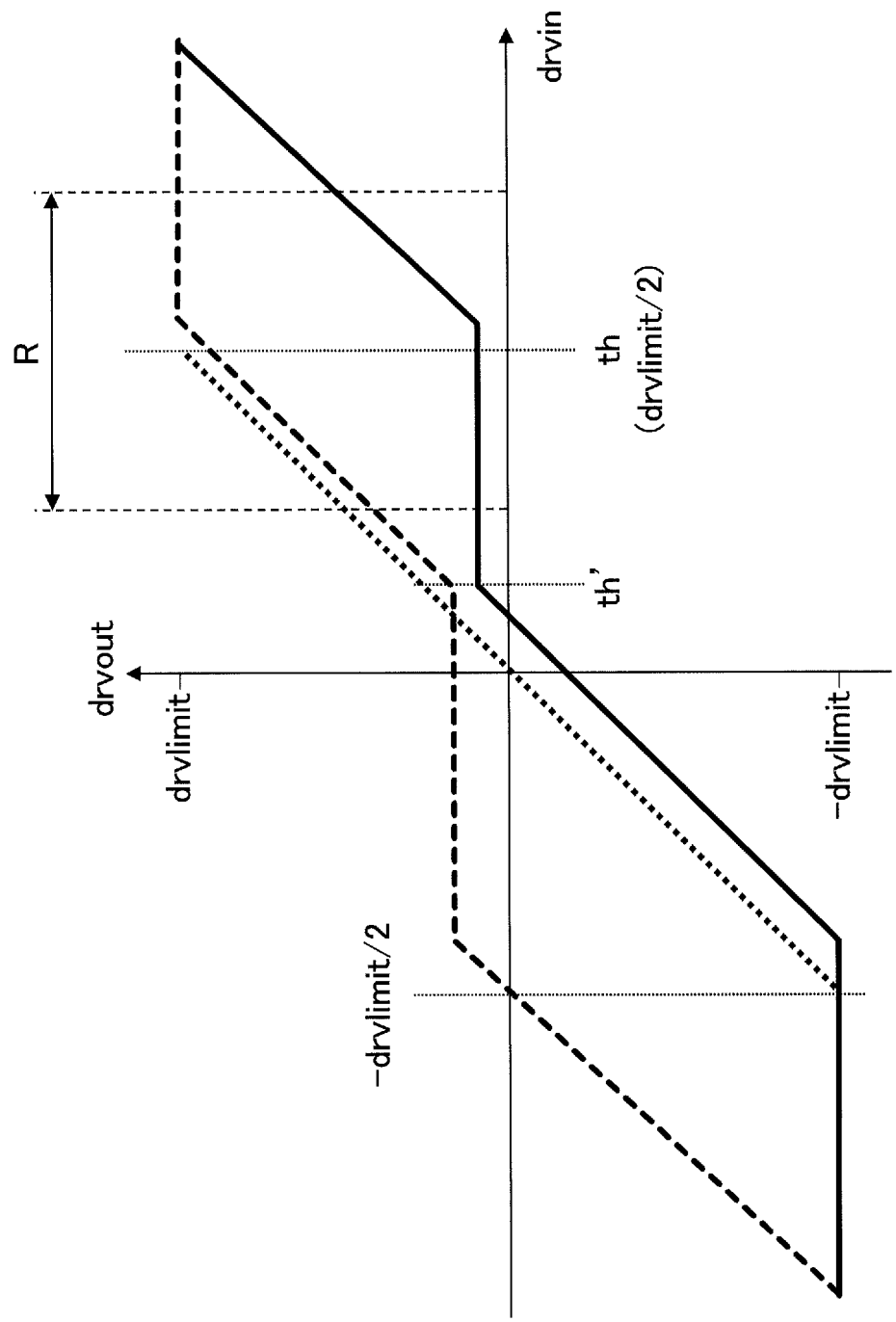
FIG. 9 is a graph illustrating a control pattern (a control pattern after corrected by the correcting unit) used by the offset control unit to perform offset control according to the second embodiment of the present invention.

FIG. 9 is a graph illustrating a control pattern (a control pattern after corrected by the correcting unit 122) used by the offset control unit 112 to perform offset control according to the second embodiment of the present invention.

FIG. 8 and FIG. 9 each illustrate a range R of the voltage command value drvin in the predetermined measurement period of time. For example, a range R is measured by the measuring unit 121, while the voltage command value drvin is maintained at around the predetermined threshold th. When the range R is measured by the measuring unit 121, the correcting unit 122 corrects a control pattern used by the offset control unit 112 such that the predetermined threshold th falls outside the range R.

For example, as illustrated in FIG. 8, in the control pattern before correction, when the voltage command value drvin becomes less than the predetermined threshold th, the drive voltage of the first motor 101 is switched from positive to negative. Namely, when the voltage command value drvin becomes less than the predetermined threshold th, the direction of the torque transmitted from the first motor 101 is switched to an opposite direction to the driving direction of the driving shaft 11.

Conversely, in the control pattern after correction illustrated in FIG. 9, the predetermined threshold th is changed to a predetermined threshold th' (a value smaller than the lower limit of the range R) that falls outside the range R. Accordingly, in the control pattern after correction illustrated in FIG. 9, even when the voltage command value drvin drops below the initial predetermined threshold th, the drive voltage of the first motor 101 is not switched from positive to negative. Namely, even when the voltage command value drvin drops below the initial predetermined threshold th, the direction of the torque transmitted from the first motor 101 is not switched to a direction opposite to the driving direction of the driving shaft 11.

In this way, according to the driving system 100' of the second embodiment, the correcting unit 122 corrects the control pattern such that the predetermined threshold th' falls outside the range R of the voltage command value drvin. Accordingly, it becomes possible to prevent the direction of the torque transmitted from the first motor 101 from being frequently changed while the voltage command value drvin is maintained at around the initial predetermined threshold th. Thus, according to the driving system 100' of the second embodiment, it is possible to eliminate backlash between the driving shaft 11 and the two motors 101 and 102, while also suppressing generation of vibration.

Note that the predetermined condition that triggers the correcting unit 122 to perform correction is not limited to the above-described case where the correcting unit 122 performs correction when a range R of the voltage command value drvin is measured by the measuring unit 121. For example, when the voltage command value drvin exceeds the predetermined threshold th, the correcting unit 122 may perform correction.

Also, in the second embodiment, a range R of the voltage command value drvin may be preliminarily determined. In this case, when the voltage command value drvin continuously falls within the range R for a predetermined period of time, the correcting unit 122 may perform correction.

Also, in the second embodiment, a range R may be repeatedly measured, and the correcting unit 122 may perform correction every time a range R is measured.

FIRST EXAMPLE

Figure 10:
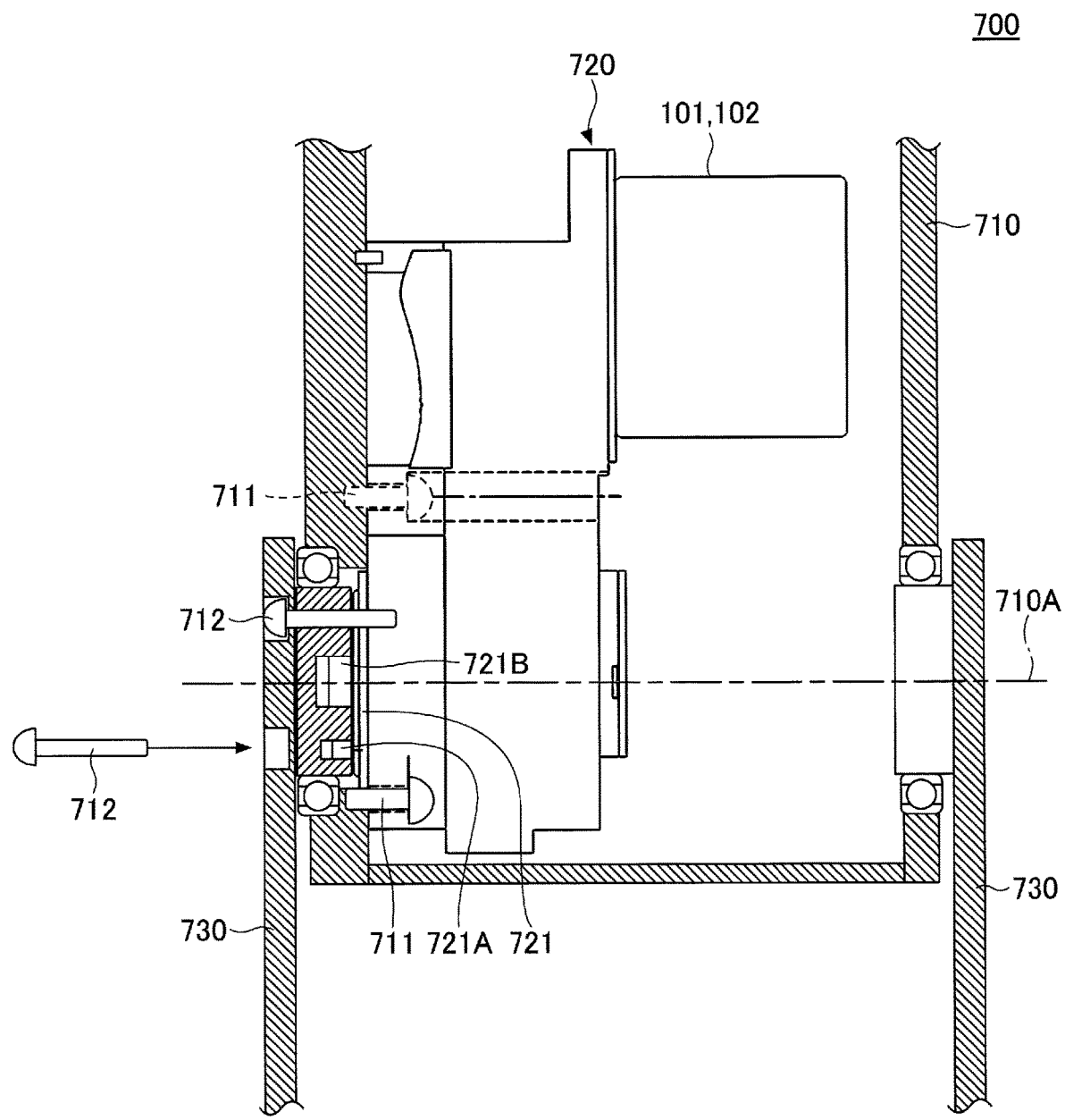
FIG. 10 is a diagram illustrating a partial schematic configuration of a robot according to a first example of the present invention.

FIG. 10 is a diagram illustrating a partial schematic configuration of a robot 700 according to a first example of the present invention. FIG. 10 illustrates a part (a joint of a robot arm) of the robot 700, and the robot 700 illustrated in FIG. 10 may be any robot having a robot arm and used in various applications, such as an industrial robot and a domestic robot. As illustrated in FIG. 10, the robot 700 includes a support body 710, a driving apparatus 720, and an arm body 730.

The arm body 730 is driven by the driving apparatus 720, and is rotatably supported by the support body 710 with a rotation shaft 710A that is located at the end portion. The arm body 730 can rotate around the rotation shaft 710A by applying a rotation force output by the driving apparatus 720.

The driving apparatus 720 is an apparatus that transmits rotation of the first motor 101 and the second motor 102 to an output flange 721 by using a deceleration mechanism having a plurality of gear stages, and causes the output flange 721 to rotate. As illustrated in FIG. 10, the driving apparatus 720 is placed inside the support body 710 and is fixed inside the support body 710 with a plurality of fixing screw 711 in such a manner that a rotation shaft of the output flange 721 coincides with the rotation shaft 710A of the arm body 730.

The output flange 721 is fixed to the arm body 730 with a plurality of fixing screws 712. Accordingly, when the output flange 721 rotates, the arm body 730 to which the output flange 721 is fixed rotates. A rotational direction and a rotation amount (rotation angle) of the arm body 730 are controlled by causing the upper-level controller to control a rotational direction and a rotation amount (rotation angle) of each of the first motor 101 and the second motor 102.

A spigot joint 721B is attached to an end portion of the output flange 721 at the center. The spigot joint 721B is embedded in a recess of the arm body 730, thereby positioning the center of the output flange 721. Also, a pin 721A projecting from the surface of the output flange 721 is fitted in another recess of the arm body 730, thereby allowing the rotational direction of the output flange 721 to be fixed and preventing the output flange 721 from slipping.

In the robot 700 with the above-described configuration, a driving shaft of the output flange 721 is configured to be driven by the two motors 101 and 102 by applying the driving system 100 (or the driving system 100') of the above-described embodiments to the driving apparatus 720. Further, as described in the above embodiments, driving command values drvout1 and drvout2 of the two motors 101 and 102 are controlled by the driving apparatus 110 (or the driving apparatus 110'). Accordingly, it becomes possible to cause the output flange 721 to be driven by a combined torque of the two motors 101 and 102 in the robot 700. At this time, it is also possible to eliminate backlash between the driving shaft and the two motors 101 and 102 while also suppressing generation of vibration.

SECOND EXAMPLE

Figure 11:
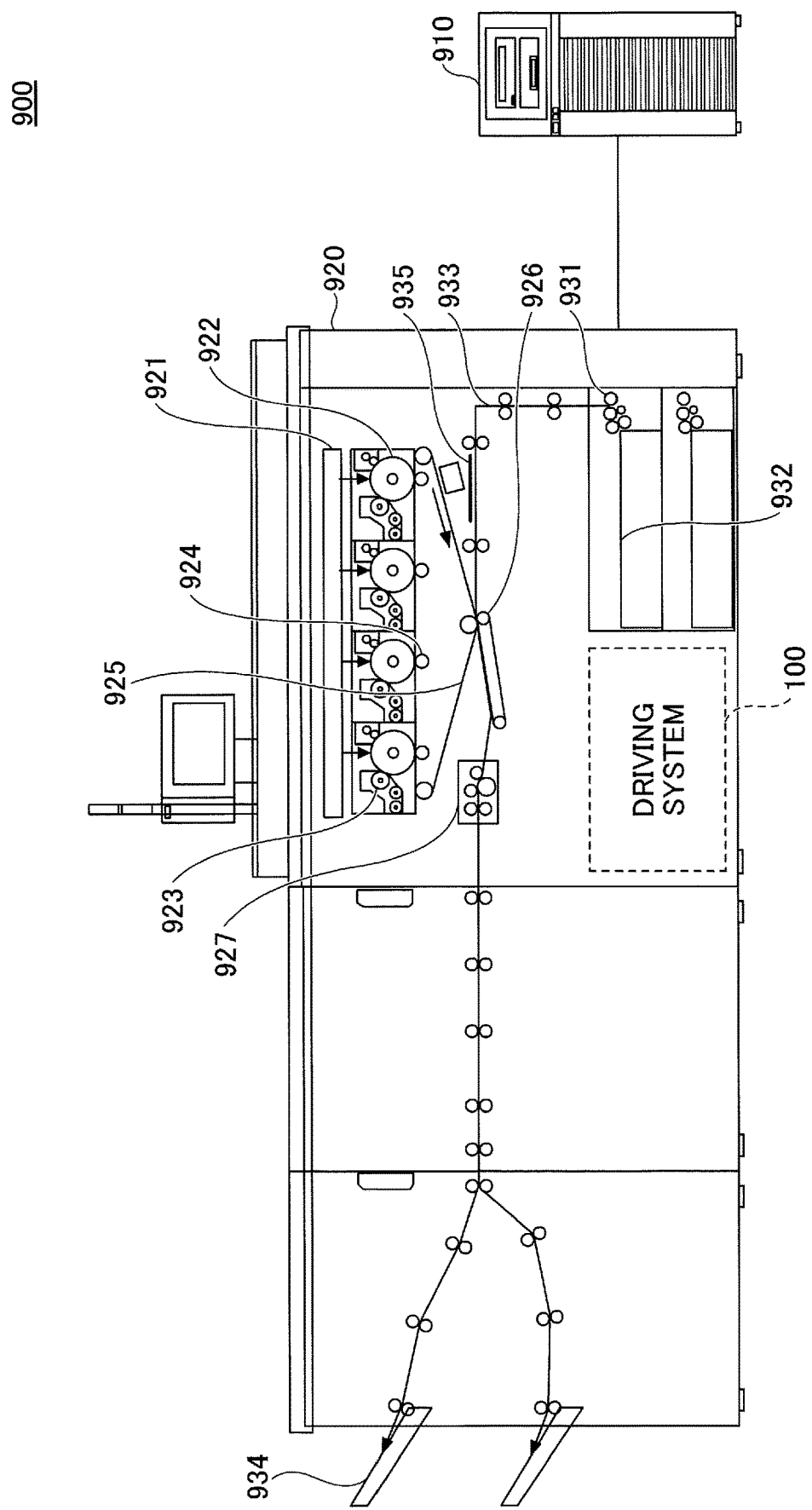
FIG. 11 is a diagram illustrating a schematic configuration of an image forming apparatus according to a second example of the present invention.

FIG. 11 is a diagram illustrating a schematic configuration of an image forming apparatus 900 according to a second example of the present invention. The image forming apparatus 900 illustrated in FIG. 11 includes a print server 910 and a main body 920. The print server 910 stores print data. The print data stored in the print server 910 is transmitted to the main body 920 in response to an instruction from a user.

The main body 920 includes an optical apparatus 921, a photoconductor drum 922, a developing roller 923, a transfer roller 924, a transfer belt 925, a transfer roller 926, a fixing apparatus 927, a conveying apparatus 931, a paper tray 932, a conveyance path 933, a paper-discharging tray 934, and recording paper 935.

The main body 920 performs processes on print data, such as color correction, density conversion, and binarization processes. The main body 920 sends the binarized print data to the optical apparatus 921.

The optical apparatus 921 uses, for example, a laser diode as a laser source. The optical apparatus 921 irradiates the uniformly-charged photoconductor drum 922 with laser light, in accordance with print data.

By irradiating the surface of the uniformly-charged photoconductor drum 922 with the laser light in accordance with the print data, electric charge disappears only from the surface irradiated with the laser light. As a result, a latent image is formed on the surface of the photoconductor drum 922 in accordance with the print data. The formed latent image is moved in a direction of a corresponding developing roller 923 along with the rotation of the photoconductor drum 922.

The developing roller 923 rotates so as to cause a toner supplied from a toner cartridge to adhere to the surface of the developing roller 153. Then, the developing roller 923 causes the toner adhering to the surface to adhere to the latent image formed on the surface of the photoconductor drum 922. Accordingly, the developing roller 923 develops the latent image formed on the photoconductor drum 922 and forms a toner image on the surface of the photoconductor drum 922.

The toner image formed on the surface of the photoconductor drum 922 is transferred onto the transfer belt 925 between the photoconductor drum 922 and the transfer roller 924. Accordingly, the toner image is formed on the transfer belt 925.

In the example illustrated in FIG. 11, the optical apparatus 921, the photoconductor drum 922, the developing roller 923, and the transfer roller 924 are provided for each of four printing colors (Y, C, M, and K). Thus, a toner image of the four printing colors can be formed on the transfer belt 925.

The conveying apparatus 931 conveys the recording paper 935 from the paper tray 932 to the conveyance path 933. The recording paper 935 conveyed to the conveyance path 933 is supplied between the transfer belt 925 and the transfer roller 926. The toner image of the four printing colors formed on the transfer belt 925 is transferred onto the recording paper 935 between the transfer belt 925 and the transfer roller 926. Next, the fixing apparatus 927 applies heat and pressure to the recording paper 935 such that the toner image is fixed. Next, the recording paper 935 is conveyed to the paper-discharging tray 934.

For example, in the image forming apparatus 900 with the above-described configuration, driving shafts of various rollers (such as a paper-feeding roller, a conveyance roller, a secondary transfer roller, and a fixing roller) are each configured to be driven by the two motors 101 and 102 by applying the driving system 100 (or the driving system 100') of the above-described embodiments. Further, as described in the above embodiments, driving command values drvout1 and drvout2 of the two motors 101 and 102 are controlled by the driving apparatus 110 (or the driving apparatus 110'). Accordingly, the various rollers can be each driven by a combined torque of the two motors 101 and 102 in the image forming apparatus 900. At this time, it is also possible to eliminate backlash between each of the driving shafts of the various rollers and the two motors 101 and 102 while also suppressing generation of vibration.

THIRD EXAMPLE

Figure 12:
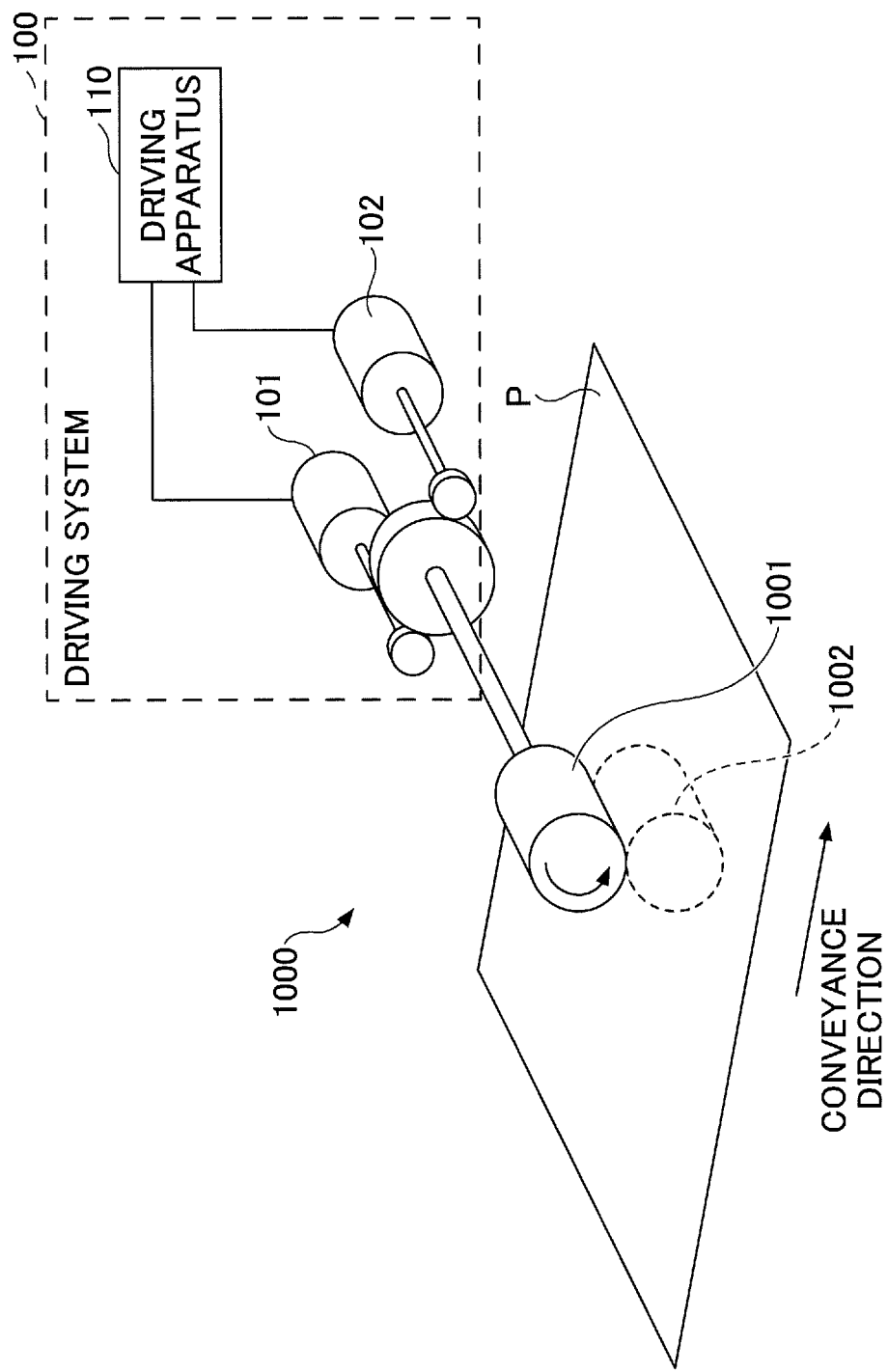
FIG. 12 is a diagram illustrating a schematic configuration of a conveying apparatus according to a third example of the present invention.

FIG. 12 is a diagram illustrating a schematic configuration of a conveying apparatus 1000 according to a third example of the present invention. The conveying apparatus 1000 illustrated in FIG. 12 is an apparatus for conveyance of paper P. As illustrated in FIG. 12, the conveying apparatus 1000 includes a conveyance roller 1001 and a conveyance roller 1002. The paper P is sandwiched between the conveyance roller 1001 and the conveyance roller 1002, and the paper P is conveyed in a predetermined conveyance direction by rotation of the conveyance roller 1001 and the conveyance roller 1002.

For example, in the conveying apparatus 1000 with the above-described configuration, a driving shaft of the conveyance roller 1001 is configured to be driven by the two motors 101 and 102 by applying the driving system 100 (or the driving system 100') of the above-described embodiments, as illustrated in FIG. 12. Further, as described in the above embodiments, driving command values drvout1 and drvout2 of the two motors 101 and 102 are controlled by the driving apparatus 110 (or the driving apparatus 110'). Accordingly, the conveyance roller 1001 can be driven by a combined torque of the two motors 101 and 102 in the conveying apparatus 1000. At this time, it is also possible to eliminate backlash between the driving shaft of the conveyance roller 1001 and the two motors 101 and 102 while also suppressing generation of vibration.

According to at least one embodiment, it is possible to provide a driving apparatus that allows two motors to drive a same driving shaft so as to eliminate backlash between the two motors and the driving shaft while also suppressing generation of vibration.

Although the embodiments of the present invention have been specifically described above, the present invention is not limited to the above-described embodiments. Various modifications and variations may be made without departing from the scope of the present invention.

For example, the first, second, and third examples in which the present invention is applied to the robot, the image forming apparatus, and the conveying apparatus have been described; however, the present invention can be applied to any apparatus as long as the apparatus employs a configuration that allows two motors to drive a same driving shaft.

As an example, the present invention may be applied to a configuration that drives a conveyance roller in a conveying apparatus for conveying a sheet-form prepreg, paper currency, and the like. Also, the present invention may be applied to a configuration that obtains a driving force from a rotational motion of a driving shaft driven by two motors in a vehicle, a robot, or amusement equipment.

What is claimed is:

1. A driving apparatus for driving a first motor and a second motor for transmitting a driving force to a same driving shaft based on a voltage command value that has been input, the driving apparatus comprising:
   a control unit configured to output a first driving command value for the first motor and a second driving command value for the second motor; and
   a switching unit configured to switch control patterns used by the control unit from one control pattern to another control pattern when the voltage command value becomes greater than or equal to a predetermined threshold,
   wherein, when the voltage command value is less than the predetermined threshold, the control unit outputs the first driving command value and the second driving command value based on the one control pattern such that a direction of a torque transmitted from one of the motors becomes different from a driving direction of the driving shaft, and
   wherein, after the switching unit switches the control patterns from the one control pattern to said another control pattern, the control unit outputs the first driving command value and the second driving command value based on said another control pattern, so as to cause the direction of the torque transmitted from the one of the motors to become same as the driving direction of the driving shaft when the voltage command value is greater than or equal to the predetermined threshold, and so as not to cause the direction of the torque transmitted from the one of the motors to become different from the driving direction of the driving shaft when the voltage command value drops below the predetermined threshold.

2. The driving apparatus according to claim 1, wherein, after the switching unit switches the control patterns used by the control unit from the one control pattern to said another control pattern, the switching unit switches the control patterns used by the control unit from said another control pattern to the one control pattern when the voltage command value becomes 0.

3. The driving apparatus according to claim 1, wherein, after the switching unit switches the control patterns from the one control pattern to said another control pattern, the control unit outputs the first driving command value and the second driving command value such that the torque transmitted from the one of the motors becomes zero or near zero when the voltage command value is less than the predetermined threshold.

4. A driving system comprising:
   the first motor;
   the second motor; and
   the driving apparatus according to claim 1.

5. A robot comprising:
   the driving system according to claim 4; and
   a driving shaft to which a driving force of both the first motor and the second motor is transmitted.

6. An image forming apparatus comprising:
   the driving system according to claim 4; and
   a driving shaft to which a driving force of both the first motor and the second motor is transmitted.

7. A conveying apparatus comprising:
   the driving system according to claim 4; and
   a driving shaft to which a driving force of both the first motor and the second motor is transmitted.

8. A driving apparatus for driving a first motor and a second motor for transmitting a driving force to a same driving shaft based on a voltage command value that has been input, the driving apparatus comprising:
   a first control unit configured to output a first driving command value for the first motor and a second driving command value for the second motor; and
   a second control unit configured to control the voltage command value based on a predetermined control pattern, such that a direction of a torque transmitted from one of the motors becomes different from a driving direction of the driving shaft when the voltage command value is less than a predetermined threshold, and configured to output the first driving command value and the second driving command value, such that the direction of the torque transmitted from the one of the motors becomes same as the driving direction of the driving shaft when the voltage command value is greater than or equal to the predetermined threshold, and
   a correcting unit configured to correct, when a predetermined condition related to the voltage command value is met, the predetermined control pattern so as not to cause the direction of the torque transmitted from the one of the motors to become different from the driving direction of the driving shaft when the voltage command value drops below the predetermined threshold.

9. The driving apparatus according to claim 8, further comprising a measuring unit configured to measure a range of the voltage command value within a predetermined measurement period of time,
   wherein, when the predetermined threshold falls within the range of the voltage command value measured by the measuring unit, the correcting unit corrects the predetermined control pattern so as to cause the predetermined threshold to fall outside the range of the voltage command value.

* * * * *